United States Patent [19]

Mogab

[11] 4,226,665

[45] Oct. 7, 1980

[54] DEVICE FABRICATION BY PLASMA ETCHING

[75] Inventor: Cyril J. Mogab, Berkeley Heights, N.J.

[73] Assignee: Bell Telephone Laboratories, Incorporated, Murray Hill, N.J.

[21] Appl. No.: 929,568

[22] Filed: Jul. 31, 1978

[51] Int. Cl.$^2$ ............... H01L 21/306; C23F 1/02
[52] U.S. Cl. ................................ 156/643; 156/646; 156/656; 156/657; 156/662; 156/665; 204/192 E; 252/79.1; 156/659.1
[58] Field of Search ............... 156/643, 646, 656, 657, 156/659, 662, 665; 204/164, 192 CE, 192 E, 298; 250/531; 252/79.1

[56] References Cited

U.S. PATENT DOCUMENTS

| | | | |
|---|---|---|---|
| 3,994,793 | 11/1976 | Harvilchuck | 204/192 |
| 4,030,967 | 6/1977 | Ingrey et al. | 156/643 |
| 4,101,411 | 7/1978 | Suzuki et al. | 204/298 |

FOREIGN PATENT DOCUMENTS 1417085 12/1975 United Kingdom ............... 156/643

*Primary Examiner*—William A. Powell
*Attorney, Agent, or Firm*—George S. Indig

[57] ABSTRACT

Plasma etching as applied to many of the materials encountered in the fabrication of LSI's is complicated by loading effect—the dependence of etch rate on the integrated surface area to be etched. This problem is alleviated by appropriate choice of etchant and etching conditions. Appropriate choice of system parameters, generally most concerned with the inherent lifetime of etchant species, may also result in improvement of etch rate uniformity on a wafer-by-wafer basis.

24 Claims, 1 Drawing Figure

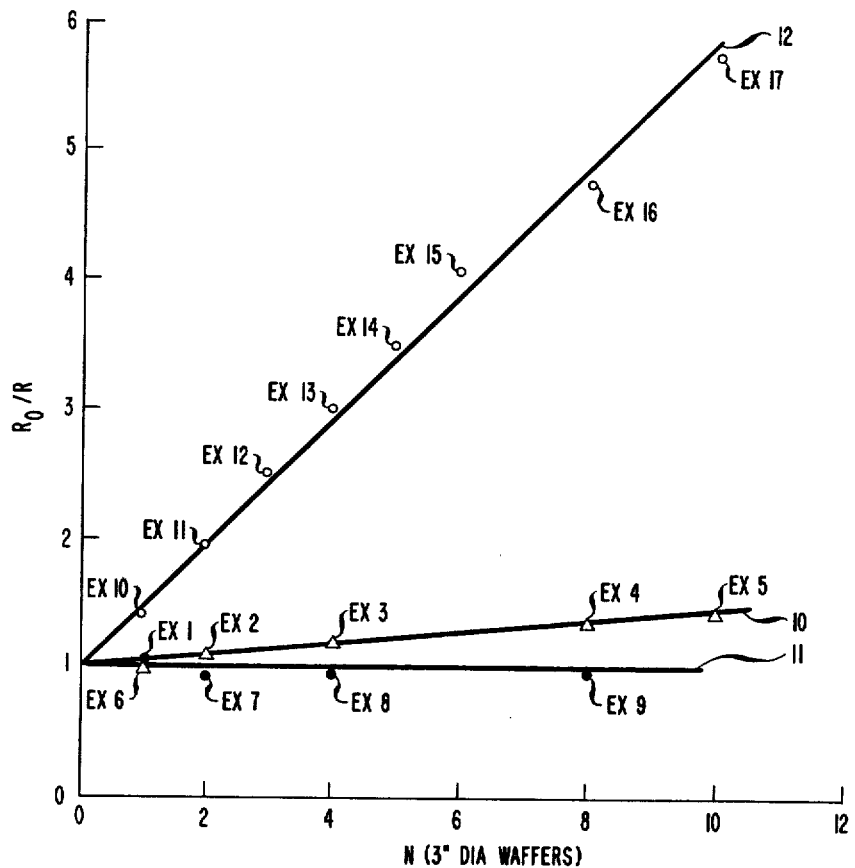

DEVICE FABRICATION BY PLASMA ETCHING

BACKGROUND OF THE INVENTION

A. Technical Field

Fabrication of small dimensioned circuit and circuit elements—e.g., large scale integrated silicon circuits (silicon LSI), involves one or more pattern delineation steps in which continuous layered material is removed by etching. Pattern configuration is generally determined by an overlying layer of aperture-patterned resist material. In accordance with prevalent practice at this time, resist patterns result from (1) exposure through a discrete mask, (2) followed by development to (a) remove unexposed material (negative resist) or (b) remove exposed material (positive resist).

The trend toward miniaturization increases the difficulty with which successive mask patterns may be superimposed. It is generally expected that further reduction to design rules in the micron or submicron range will result in increasing acceptance of maskless procedures (direct processing) in accordance with which pattern delineation is initially carried out directly in resist layers on the device undergoing fabrication.

The trend toward smaller structures is having profound effects on device fabrication, itself. Wet etching, in general use for years, and still generally satisfactory at the 4 micron level, is yielding to dry processing. Dry etching procedures, exemplified by plasma etching, offer promise of improved resolution, for example by lessening of line shrinkage inter alia, due to undercutting. Other advantages of dry etching include less severe resist adherence requirements and relative ease of disposal of etchant biproducts.

Plasma etching has been satisfactorily applied to the materials normally encountered in the fabrication of silicon integrated circuits (SIC). A structure now being manufactured includes successive layers of plasma deposited silicon nitride, aluminum, phosphorous doped amorphous oxide ("p glass"), polycrystalline silicon ("polysilicon"), field and gate layers of thermally produced silicon oxide, a transitory layer of pyrolytic silicon nitride, and, finally, the silicon wafer, itself. Plasma etching of SICs and other integrated circuits may also involve boron nitride. Plasma etching—sometimes called plasma stripping—is used in the removal of each resist layer after its masking function has been served. Resist removal may take on a somewhat more critical aspect during "lift off" procedures. Integrated circuitry, as well as discrete devices, involving other technologies as well as silicon, may depend on dry processing for these reasons. Materials to be encountered may include soft magnetic, as well as remanent magnetic, materials (e.g., permalloy and substituted yttrium iron garnet), as active optical materials (e.g., lithium niobate, lithium tantalate) as well as other metals and intermetallic compounds.

B. History

Perhaps the earliest used and still the most prevalent plasma etching procedure is based on the well-known $CF_4$–$O_2$ etchant. This material, long commercially available, has been applied to many of the above-listed materials and others in a variety of reactor designs. $CCl_4$-based etchants are usefully applied to many of the above materials.

Simultaneous etching of a plurality of wafers with $CF_4$–$O_2$ etchant may be complicated by the well-known "loading effect" phenomenon. Use of $CCl_4$ is generally characterized by this effect on all materials to which it is commonly applied. Dependence of etch rate on surface area to be etched, may result in unacceptably low throughput for high loading. This effect, in itself a significant problem, is further complicated by uneven etching. Non-uniformity, inter or intra-wafer, sometimes tolerable may become serious depending on such factors as (a) etch ratio for material to be etched relative to underlying substrate, (b) the sometimes related factor of need for and type of end point detection, (c) feature size tolerance (a consequence of loading is a sudden uncontrollable increase in etch rate as clearing begins, leading to uncontrolled undercutting during a required period of overetching).

Attempts to alleviate the loading effect through improved reactor design have been ineffective. Improvement in reactor design has, however, had some beneficial effect on etch uniformity, although non-uniformity is inherent to loading and continues to be a problem for fine-dimensioned circuitry. See R. G. Poulsen, *J. Vac. Sci. Technol.*, 14, 266 (1977) for a description of reactors presently in use.

It is evident from the literature that the loading effect is well known. It is also known that, while it is a significant obstacle for some materials, it is not for others. So for example, use of $CF_4$–$O_2$, complicated by loading when applied to polysilicon etching, is unencumbered by loading as applied to silicon oxide. Substitution of other etchants for $SiO_2$ etching has not changed the situation. Loading does not appear to be a problem for this material.

SUMMARY OF THE INVENTION

Fabrication procedures dependent upon plasma etching may be so designed as to lessen the loading effect. Generically, plasma etching in accordance with the invention invariably lessens the dependence of etch rate on surface area to be etched. Under optimum conditions—in accordance with preferred embodiments—the one may be rendered essentially independent of the other. Etch uniformity (inter or intra-wafer) may be improved.

Etching procedures relevant to the invention are for expository purposes simply defined as plasma etching. In fact, as more completely described under Detailed Description, various of the relevant procedures are sometimes designated otherwise—e.g., as reactive ion etching, reactive sputtering. It has been noted that certain prior art procedures manifest no loading effect. The inventive advance is necessarily defined in terms of procedures which manifest a loading effect. In accordance with prevalent practice, it is convenient to describe a category of relevant procedures as those which manifest a loading effect when etched by the plasma species resulting from introduction of $CF_4$–$O_2$ or $CCl_4$. While this does not constitute an exclusive category of relevant procedures, it is particularly meaningful as applied to silicon integrated circuit technology, since these etchant systems continue in general use in this field and together are applied to all materials as plasma etched in usual fabrication.

In general terms, the inventive processes depend upon specification of conditions which reduce dependence of etch rate on surface area. This is accomplished by specifying systems in which the lifetime of effective etching species is, to some significant extent, determined by conditions other than etching. Stated differently, inherent etchant species lifetime is made shorter than the lifetime due to the etching reaction itself. For these purposes the first parameter is designated "inherent lifetime" and the second, "etching lifetime." If inherent lifetime is sufficiently short such that an expected variation in surface area to be etched has little influence, the loading effect is essentially eliminated. Suitable conditions may, for example, be defined as [inherent lifetime]$\leq$0.1$\times$[etchant lifetime] for maximum loading in the reactor under consideration.

Lessening of the loading effect, in itself, contributes toward uniformity of etching. Optimized uniformity depends upon conditions which result in reasonably uniform arrival of etchant species at the surface to be etched. In addition, lessening of the loading effect is tantamount to lessening of at least one contribution to undercutting.

While optimized etching depends on a number of parameters, a preferred embodiment depends upon an inherent etchant lifetime which is short due to an inherent recombination in the plasma. In accordance with this preferred embodiment, etchants may be considered as being two part: (a) active etchant species and (b) recombinant.

DETAILED DESCRIPTION

Definitions

Plasma etching is that generic family of procedures in which substrate material removal is primarily due to chemical reaction, in turn dependent upon reactant species in the plasma. Relevant procedures are to be distinguished from those in which removal is primarily due to momentum exchange. The latter category of procedures includes ion milling, and forms of ion etching and sputter etching which do not manifest the loading effect to which the invention is directed. It is, of course, inherent that some momentum exchange occur due to the plasma field itself. Accordingly, whereas surface removal is not primarily due to momentum exchange, momentum exchange does occur and, in fact, may be responsible in part for initiating or enhancing chemical activity. In terms of the invention, "plasma etching" procedures of relevance are those in which the loading effect is lessened. These are defined in the following.

Relevant Plasma Etching: Plasma etching processes which are characterized by loading effect. For processes of greatest consequence in silicon technology where etching has generally been carried out in $CF_4$-$O_2$, or $CCl_4$ it is convenient to define relevant plasma etching as that which manifests the loading effect in plasmas of these etchants. Etch rate of silicon oxide in the $CF_4$-$O_2$ plasma system results in an etch rate variation of less than 25 percent from full load to 10 percent load for any particular apparatus and otherwise constant etching conditions. Materials encountered in SIC processing which manifest loading in these terms include silicon, both single crystalline and polycrystalline, (the latter designated polysilicon), aluminum, plasma deposited silicon nitride, pyrolytic silicon nitride, boron nitride, and resists of the various types utilized.

Loading Effect: This term designates surface area dependent rate of etching. In principle, this dependence is never totally avoided in practice. Even when detectable, it may be tolerable to a certain extent; so, for example, silicon nitride etching is generally noncritical, in that relatively large feature spacing is involved, so that substantial loading effect may be tolerated. While quantification of the term may not be uniformly meaningful, a 25 percent difference in etch rate as between 10 percent capacity and full capacity for the equipment in use is a convenient line of division.

Etchant Lifetime

(a) Inherent Etchant Lifetime

Mean lifetime of plasma-generated etchant species in the absence of surface to be etched. Termination is here due to recombination of the plasma generated species, generally with species corresponding with a component of the gaseous material introduced into the plasma.

(b) Etching Lifetime

Lifetime of the plasma generated etchant species due to chemical reaction with the surface undergoing etching. It is convenient to refer to the etching lifetime for total capacity, i.e., for total loading of the reactor carrier, this quantity is referred to as minimum etching lifetime.

General

Embodiments of the invention invariably depend upon inherent etchant lifetime which is short relative to etching lifetime—in general which is no more than 10 percent of minimum etching lifetime. Described embodiments inherently meet this requirement. Operative quantities are amenable to measurement. Inherent etchant lifetime may be measured by suitable means simply by operating the reactor without etchable material. The power supply is turned off; and the persistance time of the etchant species is tracked, for example, by measuring the absorption of emission from a CW laser operating at an appropriate wavelength. Alternative means include chemical titration at at least two positions downstream of the reactor.

Considerable experimentation conducted on systems manifesting loading effect suggest etching lifetimes of the order of 10 milliseconds or greater under conditions resulting in practical etch rates. Requisite inventive conditions are therefore met for inherent etchant lifetime of a maximum of one millisecond. To provide for measurement error as well as variation in values dependent upon the measurement technique used, it is prescribed in preferred embodiments that inherent etchant lifetime be at a maximum of 0.1 millisecond. This mean value is considered sufficient characterization of any inventive process in which the deleterious effect of loading is perceptibly reduced by comparison with the prior art within the described context. Preferred processes are conducted under conditions such as to result in inherent etchant lifetime no greater than about 0.01 millisecond. This value, in fact, corresponds with that indicated for one experimental system in which the loading factor was at a level of below one percent (on the basis of a comparison between total capacity and 10 percent capacity for given reactor).

For many purposes, short inherent etchant lifetime is realized simply by appropriate choice of the gas composition introduced into the plasma. The nature of the composition under these circumstances, is such to inherently provide for recombination. Recombinant, in preferred embodiments is chemically distinct from that of the etchant species or etchant species precursor. Useful systems are sometimes based on etchant-recombinant species which are the same.

It has been indicated that dependence of etching rate on surface area is, itself, disadvantageous. This dependence is lessened—sometimes effectively eliminated in accordance with the invention. Assuming essential elimination of the loading effect, uniformity is assured by appropriate etching conditions. The most significant conditions are concerned with flow pattern; and this, in turn, is generally determined by reactor design. Data presented in the examples is generally derived from procedures conducted in a parallel plate reactor providing for radial flow of the form resulting by use of apparatus described in U.S. Pat. No. 3,757,733. Etch uniformity at least sufficient for LSI state of the art may be realized by practice of the invention on such apparatus.

Etchant Composition

Examples generally rely upon short inherent etchant species lifetime due to recombination on a site provided by the entrant gas. This site, which may be inert; may result only in the discharge region; may be distinct from or identical to the etching species, chemically reacts with the etchant species within a mean time generally of a maximum of 0.1 millisecond (preferably 0.01 millisecond) to produce a relatively low etching or, preferably, a nonetching species. This reaction product may be identical to initial reactant or not. Etchant systems utilized in the examples include $CF_3Cl$, $CF_3Br$, and $C_2F_6$-$Cl_2$. Mass spectroscopic analysis, as verified by other techniques, indicates the active etchant species to be atomic Cl, Br, and Cl, respectively. On this basis, recombinant in the first two instances is $CF_3$ or $CF_3$-derived. The recombinant, in the third instance, is again a fluorocarbon- (based on $CF_3Cl$ end product, likely the same $CF_3$ or $CF_3$-derived species). A fourth system (primarily of academic interest due to low etch rate), $C_2F_6$, is believed to yield $CF_3$ radicals in the plasma state indicating recombination to be between etchant species. A fifth system makes use of $BCl_3$-$Cl_2$. Emission spectroscopy reveals atomic chlorine, at least a contributor to the etchant species. Recombinant is again established as inherent in the bulk plasma—likely $BCl_2$ or other $BCl_3$-derived species.

Studies on the $C_2F_6$-$Cl_2$ system have included varying relative amounts of the two substituents, as well as replacing $C_2F_6$ by argon. In the latter, the fact that loading was unaffected for otherwise identical conditions, indicates $Cl+Cl=Cl_2$ to be an operative recombination mechanism. The former suggests, however, that a derived fluorocarbon serves as a recombinant, as well.

A general preference for chemically distinct recombinant and etchant is based on considerations other than loading per se. Separation of the two species permits an added degree of flexibility to permit tailoring of etch rate, etch profile, etc.—factors of consequence in most etching processes (see U.S. Application Ser. No. 929,549, filed July 31, 1978 (Harshbarger et al 2-2-3-6-5)). The preference is in terms of species in the plasma so the single gas $CF_3Cl$ as introduced yields chemically distinct recombinant and etchant species. While the 1:1 atom ratio implicit in this compound happens to fall within a suitable range for many etching processes, it may be altered by introduction of additional chlorine or additional fluorocarbon ($Cl_2$ or $C_2F_6$). Experimentation indicates total identity between effective plasma species, e.g., Cl (whether produced from $CF_3Cl$ or from $Cl_2$).

In many systems appropriate for practice of the invention, either effective species may act both as etchant and recombinant. However, for most such systems, the primary etchant species and the primary recombinant species are chemically distinct. In many suitable systems, either species is nonloading. This observation is often of little practical consequence, however, since otherwise desirable etching characteristics may not be satisfied. So for example, $C_2F_6$ is a nonloading etchant for most systems of concern albeit at an etch rate which is far too low for most practical purposes. Chlorine is itself a nonloading etchant for many purposes, but at an etch rate uncontrollably rapid for most contemplated thin film usage. Etch rate of $Cl_2$ may be reduced to tolerable levels by dilution for example with argon and this generally meets the invention requirements. Unlike halocarbon, rare gas diluent does not operate as recombinant. Halocarbon recombinant, due to preferred reaction in the vicinity of etch walls, affords a mechanism which, in accordance with copending application Ser. No. 929,549, filed July 31, 1978 (Harshbarger et al 2-2-3-6-5) permits profile control—permits attainment of vertical walls with minimal undercutting. The same function is served by other halides, e.g., by the $BCl_3$ of the aluminum etchant example.

It is apparent that composition may be fixed for certain inventive species. Where the primary etchant species is attributable to the introduction of atomic halogen precursor included as part of a gas mixture, it is reasonable to fix etchant/recombinant atom ratio between 1 percent and 95 percent in terms of the gas mixture as introduced into the plasma. Both limits have been found to yield reasonable etching behavior under appropriate conditions. Use of a single compound, e.g., $CF_3Cl$ serves as a valuable criterion for the species in the plasma. This 50 at. % ratio as introduced, necessarily produces the same initial ratio, within the plasma. It serves as a useful etchant from many standpoints, of course including loading, but does not, under general conditions, yield ideal anisotropic behavior. As indicated in the copending application cited above the optimal ratio from the standpoint of etch profile is approached by increasing the amount of $CF_3$ (e.g., by introduction of molecular $C_2F_6$).

It is well known that other considerations may lead to further compositional variations, for example, dilution may be indicated with a view to stabilizing plasma conditions. So helium prevents plasma inhomogeneity when included with $CF_3Br$ and lessens this contribution to nonuniformity.

Other Considerations

In general, loading is relatively insensitive to conditions such as power and pressure, although optimized etching may give rise to a preference, e.g., lessening of power to assure plasma confinement. In marginal situations, i.e., where some loading is perceptible, it is found that temperature decrease may result in less loading. This relatively minor influence has been tentatively ascribed to an increase in etching lifetime.

Preferred embodiments which serve as examples make use of recombination sites inherent in the gaseous system. While this is strongly supported by spectroscopic analysis of exiting gases, the possibility that recombination occurs preferentially on solid surfaces—resist and/or surface being etched—is not precluded. In fact, necessarily exothermic recombination favors reaction at a solid surface which serves as a heat sink. The likelihood that some or all of the recombination takes place on a solid wall gives rise to the possibility of alternate mechanisms including simple adsorption (resulting in trapping of etchant species) as well as, use of active surfaces—possibly resist surfaces to result in a reaction which itself is largely responsible for shortened inherent etchant lifetime.

The general thrust of the invention is concerned with loading. It has been indicated that compositional, as well as other etchant conditions, may be tailored to other desired behavior. Such conditions may be discussed in terms of microcircuitry as well as small dimensioned devices where layers to be etched are likely of the order of microns or less. Etch rates under such circumstances are likely within the range of from 100 to 200 Angstroms/min. Lower rates may be inexpedient from the standpoint of throughput, while higher rates are difficult to control. It is possible to specify plasma power ranges as between about 100 to 5000 watts for a 16" reactor (0.05 to 5 watts/cm$^2$ with a preferred range of from 0.1 to 1 watt/cm$^2$). The maximum may be exceeded for attainment of higher etch rates particularly where layer thickness is several microns or more. The minima corresponds with generally tolerable minimum etch rates. Pressures are likely to be within the range of from 0.005 Torr to 1 Torr (5 to 1000 microns). The lower limit encroaches on reactive ion etching—with further reduction resulting in possible lattice damage. Exceeding the maximum tends toward poor plasma confinement and consequent etch nonuniformity.

DRAWING

The FIGURE on coordinates of etch rate ratio for 10 percent:100 percent loading on the ordinate and number of wafers on the abscissa contains plotted data indicative of degree of loading. The FIGURE is discussed in conjunction with the examples.

EXAMPLES

General Conditions: For purposes of comparison, examples were generally carried out in one type of apparatus and, within example sets, under similar conditions. Experiments selected for examples were carried out in an 18" diameter radial flow parallel plate reactor. The apparatus contains two horizontal parallel hollow metal electrodes in a pyrex vacuum enclosure. In operation, rf power at a frequency of 13.56 megahertz was applied to the upper plate to initiate and sustain a discharge. The lower plate held at ground potential served as the platen for the material to be etched. Discharge was operated in the 0.1 to 1.0 torr range with continuous flow of etchant gases through the discharge region. Effluent was exhausted by a 25 cu. ft./min. two stage mechanical forepump. Prior to initial pump out, hot water (~80 degrees C.) was passed through both electrodes for a few minutes to minimize water condensation during loading. The chamber was then opened and material to be etched was placed on the platen. The chamber was then closed and the pump set in operation. When a pressure of about 30 microns of mercury was attained, hot water was replaced by flowing cold water (~25 degrees C.). Pumping was continued to a base pressure of a few microns and etchant gas flow was commenced. Etch conditions were generally maintained as follows: Pressure—0.1 to 1.0 torr
Flow rate—20 to 200 SCCM (cm$^3$/min. as standardized at room temperature)
rf power—100 to 2000 watts
Electrode spacing—7 to 30 millimeters
Substrate temperature—25 to 30 degrees C.

Examples 1-5: (These points are plotted as curve 10 of the FIGURE.) p Single crystalline silicon was etched by CF$_3$Br-30% He, 500 watts of power, 0.3 torr, 30 mm electrode spacing, 25 degrees C. platen temperature, 175 SCCM flow rate, 3" wafer diameter. The number of wafers and resultant etch rates are tabulated.

| Example | Number of Wafers | Etch Rate (Angstroms/min.) |
|---|---|---|
| 1 | 1 | 606 |
| 2 | 2 | 573 |
| 3 | 4 | 524 |
| 4 | 8 | 477 |
| 5 | 10 | 448 |

Examples 6-9: (These examples are plotted as curve 11 of the FIGURE.)

Wafers of the same surface composition and size were etched, this time in undiluted CF$_3$Cl at 200 watts, 0.35 torr, 30 mm electrode spacing, 25 degrees C. platen temperature and 200 SCCM flow rate.

| Example | Number of Wafers | Etch Rate (Angstroms/min.) |
|---|---|---|
| 6 | 1 | 193 |
| 7 | 2 | 205 |
| 8 | 4 | 205 |
| 9 | 8 | 205 |

Examples 10-17: (These prior art points are plotted as curve 12 of the FIGURE.)

This data is presented for comparison purposes and relates to experiments conducted with CF$_4$-8% O$_2$ etchant again on single crystalline silicon layers as in the previous examples. Data illustrative of loading is set forth in tabular form below.

Conditions were 300 watts power, 0.3 torr pressure, 30 mm electrode spacing, 100 degrees C. platen temperature, 150 SCCM flow rate.

| Example | Number of Wafers | Etch Rate (Angstroms/min.) |
|---|---|---|
| 10 | 1 | 4158 |
| 11 | 2 | 3012 |
| 12 | 3 | 2334 |
| 13 | 4 | 1926 |
| 14 | 5 | 1656 |
| 15 | 6 | 1416 |
| 16 | 8 | 1224 |
| 17 | 10 | 1008 |

Examples 18 and 19: (Related to etching of 3" diameter wafers supporting phosphorous-doped polycrystalline silicon in the C$_2$F$_6$-Cl$_2$ system.)

Examples were operated under reactor conditions: 400 watts power, 0.35 torr pressure, 30 mm electrode spacing, 25 degrees C. platen temperature, 175 SCCM flow rate of 15% Cl$_2$, 85% C$_2$F$_6$.

| Example | Number of Wafers | Etch Rate (Angstroms/min.) |
|---|---|---|
| 18 | 1 | ~950 |

-continued

| Example | Number of Wafers | Etch Rate (Angstroms/min.) |
|---|---|---|
| 19 | 4 | ~950 |

Examples 20 and 21: (Etchant 90 percent $Cl_2$:10 percent $C_2F_6$.)

| Example | Number of Wafers | Etch Rate (Angstroms/min.) |
|---|---|---|
| 20 | 1 | ~3440 |
| 21 | 5 | ~3440 |

Examples 22–25:

For the particular series reported, introduced gas was of the composition 95 percent $BCl_3$-5 percent $Cl_2$. Wafers 3" in diameter supported 4000 Angstroms thick, aluminum—4 percent copper alloy, 600 watts power, 0.1 torr—conditions were otherwise constant from example to example.

| Example | Number of Wafers | Etch Rate (Angstroms/min.) |
|---|---|---|
| 22 | 1 | ~300 |
| 23 | 4 | ~300 |
| 24 | 6 | —300 |
| 25 | 8 | ~300 |

Note: The "loading effect" to which the invention is directed is concerned with the dependence of etch rate on the total surface to be etched. Surface presented by each individual wafer for each set of examples was identical. The first three sets were based on unmasked surfaces. Examples 18–21 were masked to define a standardized pattern from wafer-to-wafer. Wafers in the last set of examples were also masked.

I claim:

1. Process for fabrication of at least one article comprising at least one operation during which the article undergoing fabrication comprises a surface to be etched wherein the said article surface is maintained within a plasma environment contained within an apparatus, the plasma resulting from imposition of an rf electrical field across gaseous matter between two electrodes, the surface to be etched consisting of a composition manifesting a loading effect when etched by a plasma environment produced across a gas mixture consisting essentially of $CF_4$ and $O_2$, or $CCl_4$, the said surface consisting essentially of a composition selected from the group consisting of elemental silicon, elemental aluminum, silicon nitride, boron nitride, and resists utilized in SIC processing, the said loading effect being defined as a variation in etch rate of at least 25 percent for a loading variation of from 10 percent capacity to 100 percent capacity for the said apparatus, etching being primarily due to reaction of the said surface with a primary etchant species characterized in that the said gaseous matter is of composition such as to result in two active chemical species within the said plasma, in which the two species are chemically distinct, the first of which, denoted primary etchant species, reacts with the said surface to result in removal of surface material and the second of which, denoted recombinant species, primarily serves to combine with unreacted primary etchant species to result in the said mean inherent lifetime, and in which the amount of recombinant species is maintained at a level sufficient to reduce mean inherent lifetime of the primary etchant species to a value which is no more than one-tenth as great as the mean lifetime due to chemical reaction with the surface resulting in etching.

2. Process of claim 1 in which the article surface is selectively etched, with regions to be etched being defined by apertures within an overlying masking layer.

3. Process of claim 2 in which the said gaseous matter is continuously flowing.

4. Process of claim 1 in which the said mean inherent lifetime is no greater than 0.1 millisecond.

5. Process of claim 4 in which the said mean inherent lifetime is no greater than 0.01 millisecond.

6. Process of claims 1, 2, 3, 4, or 5 in which the said gaseous matter yield atomic halogen in the plasma.

7. Process of claim 6 in which the said halogen is chlorine.

8. Process of claim 7 in which the gaseous matter is of such composition as to yield a halide within the said plasma.

9. Process of claim 8 in which the said halide is a fluoride.

10. Process of claim 8 in which the said halide is a halocarbon.

11. Process of claim 10 in which the said halocarbon is a fluorocarbon.

12. Process of claim 11 in which the said gaseous matter yields atomic chlorine and $BCl_3$ in the said plasma.

13. Process of claim 12 in which the said gaseous matter comprises $CF_3Cl$.

14. Process of claim 12 in which the said gaseous matter comprises $CF_3Br$.

15. Process of claim 14 in which the said gaseous matter contains a diluent.

16. Process of claim 15 in which the said diluent consists essentially of helium.

17. Process of claim 11 in which the said gaseous matter consists essentially of a mixture of $C_2F_6$ and $Cl_2$.

18. Process of claims 1, 2, 3, 4, or 5 in which the said surface comprises elemental silicon.

19. Process of claim 18 in which the said surface is polycrystalline.

20. Process of claim 1 in which the said article includes at least one silicon integrated circuit.

21. Process of claim 1 in which the gaseous matter is of such composition as to yield a halide within the said plasma.

22. Process of claim 21 in which the said halide is a fluoride.

23. Process of claim 21 in which the said halide is a halocarbon.

24. Process of claim 23 in which the said halocarbon is a fluorocarbon.

* * * * *